United States Patent [19]

Hugenholtz

[11] 3,916,334

[45] Oct. 28, 1975

[54] FREQUENCY SYNTHESIZER USING SPECTRUM SHIFT INTERPOLATION

[76] Inventor: Eduard Herman Hugenholtz, 16 Brucedale Crescent, Willowdale, Ontario, Canada

[22] Filed: Apr. 24, 1974

[21] Appl. No.: 463,494

[52] U.S. Cl. ........................ 331/4; 331/19; 331/22; 331/25; 331/31

[51] Int. Cl.[2] ........................................ H03B 3/04

[58] Field of Search ................ 331/4, 19, 22, 25, 31

[56] References Cited

UNITED STATES PATENTS

| | | | |
|---|---|---|---|
| 3,268,831 | 8/1966 | Noordanus et al. | 331/19 X |
| 3,600,699 | 8/1971 | Orenberg | 331/22 X |

*Primary Examiner*—Siegfried H. Grimm

*Attorney, Agent, or Firm*—Rogers, Bereskin & Parr

[57] ABSTRACT

According to a particular preferred embodiment of the present invention, a frequency synthesizer system is provided for producing a signal having a frequency which is variable in discrete steps over a predetermined frequency range. Each frequency step has a predetermined maximum size and means are provided for including interpolation frequencies between each step. The frequency synthesizer system comprises circuit means for combining a primary reference signal frequency generated by a fixed frequency oscillator with a selected sub-harmonic of an externally generated interpolation signal frequency to produce a secondary reference signal frequency. A harmonic selection system generates harmonics of the secondary reference signal frequency and in response to a programming system selects a harmonic of the secondary reference signal having the same harmonic number as the selected sub-harmonic of the interpolation frequency. The harmonic selection system generates a control signal which controls the frequency of a controllable oscillator tuning and phaselocking the frequency of the controllable oscillator to a frequency equal to the frequency of the selected harmonic of the secondary reference signal frequency. Using the programming system the frequency of the controllable oscillator can be varied in steps, each having a maximum size equal to the primary reference signal frequency thereby generating a frequency which is displaced from the frequency of a harmonic of the primary reference signal frequency by the interpolation frequency.

15 Claims, 7 Drawing Figures

FREQUENCY SYNTHESIZER USING SPECTRUM SHIFT INTERPOLATION

This invention relates to a frequency synthesizer which produces an output signal having a decimal adjustable frequency. The output frequency is derived from a stable frequency source such as a crystal controlled oscillator and may be varied over a prescribed frequency range.

In known systems of multi-decade frequency synthesis one of two basic techniques is generally employed. The first is a gated frequency divider system and the second a pulse synchronized system in combination with side chain arrangements which employ numerous oscillators generating frequencies slightly displaced from each other.

In the gated frequency divider system a signal from a controllable oscillator is divided down in frequency by a chain of decade frequency dividers. Each divider, except the final one, is provided with a gate actuated programming system allowing it to absorb a number of cycles of the input signal, from a related divider only, for one complete cycle. This is done by using gated frequency divider circuits and generating a trigger signal from the output of the entire divider chain to reset the gating system. Consequently, depending on the programmed divider ratio, a number of pulses is added to the number which is required to cause an output pulse to be generated by the related divider. The last divider of the chain is a conventional programmable divider. The output signal frequency of the entire divider chain is compared with a precise, highly stable reference signal having a frequency equal to the smallest interpolation frequency step in the system.

Frequency comparison may be carried out by a phase discriminator having an output signal which is used to control the frequency of a controllable oscillator until a phase-lock occurs between the divider chain output signal frequency and the reference signal frequency. The controllable oscillator frequency then equals the reference frequency multiplied by the programmed digital figures of the successive dividers counting from the largest digital step as determined by the last frequency divider.

The advantages of this system include unambiguous frequency lock-in over a relatively wide frequency range and the absence of a requirement for any form of tuned circuit or auxiliary oscillators. However, when relatively high output frequencies are required high speed divider and gating circuits are necessary. Such circuits are difficult to design and are relatively expensive. A further disadvantage occurs in a situation where multiple digits are concerned since the phase stability of the output oscillator is poor due to the large division ratio, unless special additional arrangements are made. This in turn adds to the complexity of the system.

The second technique employs a pulse synchronized system in which a signal from a controllable oscillator is mixed in a controllable pulse mixer circuit with a first frequency spectrum which contains harmonics of a primary reference frequency used in the system. The output from the mixer provides a control signal for the controllable oscillator thereby synchronizing its output frequency with a selected harmonic frequency contained in the first frequency spectrum. The selection of a specific harmonic frequency is controlled either by pretuning the controllable oscillator frequency to the vicinity of the desired output frequency or by means of a digital control system.

A second harmonic spectrum is generated and coupled into a second pulse mixer. The second harmonic spectrum contains harmonic frequencies of an auxiliary reference frequency. The harmonics in the second harmonic spectrum have frequencies which differ slightly from the harmonic frequencies contained in the first harmonic spectrum. The frequency difference is such that the output signal from the second pulse mixer can be used to operate the first pulse mixer and thereby inhibit a phase-lock on all harmonics in the first harmonic spectrum except for the desired one. Alternatively, the auxiliary pulse mixer provides a signal which has a specific frequency which enables a phase-lock on the desired harmonic of the reference pulse spectrum. Frequency selected is performed by shifting the fundamental frequency of the second frequency spectrum and comparing the difference between the primary reference frequency and the auxiliary reference frequency with the output of a programmed frequency divider having a variable dividing ratio. The choice of the selected frequency is determined by selecting the dividing ratio.

Pulse synchronized systems have an advantage over gated divider systems because pulse mixing can be performed relatively simply at a considerably higher frequency than can be attained with a programmed gated divider system. Moreover, the phase stability of the pulse synchronized system is substantially greater since the maximum phase difference in the order of one radian is a practical limit. However, in order to convert a basic pulse synchronized system to a multi-decade system a number of phase-locked oscillators are usually required. These oscillators are then phase-locked on frequency spectra with different interpolations steps as basic frequencies. The signals from these oscillators are intermixed and the difference frequencies are phase-locked to still another oscillator.

Consequently, this system requires oscillators on or near the output frequency which requires relatively accurate frequency tracking when a different output frequency is selected.

Several other methods of frequency synthesis are known and generally described in Frequency Synthesizers/A Survey of Techniques, by J. Noordanus IEEE Transactions on Communication Technology, Volume COM 17, No. 2, April, 1969. These techniques generally lead to an increased amount of complexity in the frequency synthesizer systems in which they are employed.

It is the purpose of the present invention to provide a frequency synthesizer which uses digital techniques and which provides a simplified frequency synthesizer employing pulse mixers while avoiding the use of side chain oscillators at high frequencies.

According to a particular preferred embodiment of the present invention a frequency synthesizer system is provided for producing an output signal having a frequency which is variable over a predetermined frequency range. The output signal may be varied in discrete frequency steps having a predetermined maximum size. Interpolation steps between each discrete frequency step are also provided.

A crystal controlled oscillator is used to generate a primary reference signal frequency. This frequency or a sub-harmonic of it corresponds to the largest discrete frequency step in the output signal. The interpolation steps are included by generating a secondary reference signal frequency having a frequency equal to the primary reference signal frequency displaced by a selected sub-harmonic of an interpolation signal frequency. The interpolation signal is generated externally. A variable ratio frequency divider coupled to the interpolation signal is used for producing the selected sub-harmonic of the interpolation signal frequency. The secondary reference signal frequency may be produced by a controllable oscillator having a feedback control loop responsive to a signal derived from the primary reference signal and a signal derived from the sub-harmonic of the interpolation signal. The feedback control loop establishes the frequency of the controllable oscillator at a value equal to the secondary reference signal frequency.

A programming system provides a control signal which has a unique value for each harmonic of the secondary reference signal frequency. The programming control signal is coupled to a harmonic selection system which generates a further control signal for controlling a controllable output oscillator which generates the variable frequency output signal. Depending on the particular unique value of the programming control signal, the harmonic selection system causes the controllable oscillator to oscillate at a frequency equal to a selected harmonic of the secondary reference signal frequency. The harmonic selected has the same harmonic number as the selected sub-harmonic of the interpolation signal frequency. Consequently, the controllable output oscillator generates a signal having a frequency equal to the selected harmonic of the primary reference signal frequency displaced by a frequency equal to the interpolation signal frequency.

Further objects and advantages of the present invention will appear from the following description taken together with the accompanying drawings, in which.

Figure 1:
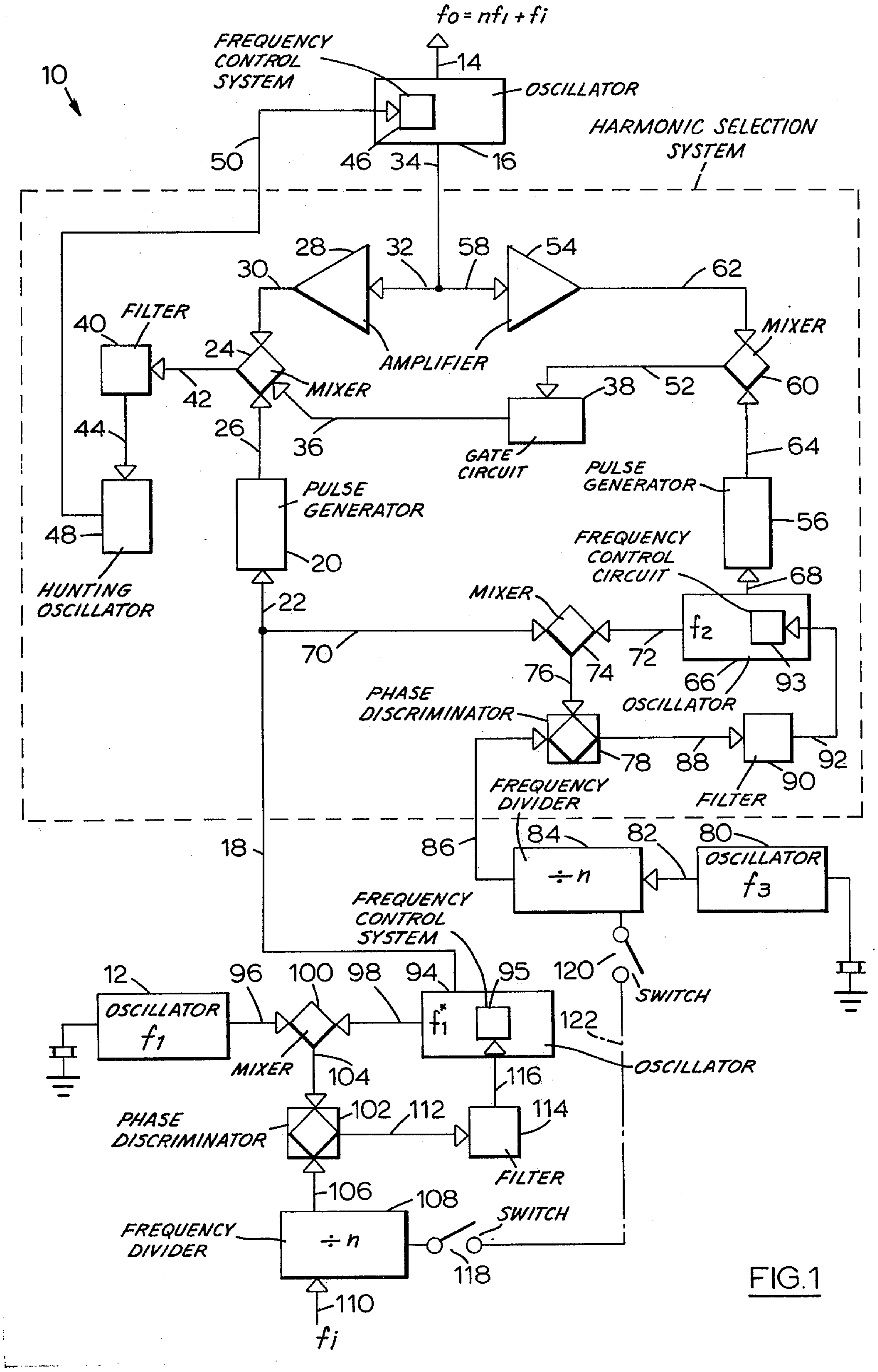
FIG. 1 is a block diagram of a frequency synthesis element.

FIG. 1 shows at reference numeral 10, a block diagram of a frequency synthesis element for use in a multi-decade frequency synthesizer. The frequency synthesis system shown is based on the use of a pulse synchronized system using digital techniques for harmonic selection. The general operation of the frequency synthesis element 10 may be described as follows. The desired output signal is provided by a controllable oscillator having a variable output frequency $f_o$ which is phase-locked on a selected harmonic in a first harmonic spectra containing harmonics of a fundamental frequency equal to a primary reference frequency $f_1$. This establishes the largest decimal step in the system. Interpolation to lower decade steps is not accomplished by the use of side chain arrangements but rather the primary reference frequency from which the first harmonic spectra is generated is shifted by an amount required to provide the desired interpolation to lower decade steps.

The frequency shift requires shifting the frequency of the primary reference frequency by an amount equal to the required interpolation frequency divided by a factor $n$, where $n$ is the harmonic number of the selected harmonic of the primary reference frequency. As a result the controllable oscillator frequency $f_o$ is displaced with respect to the primary reference frequency of the system by an amount equal to the required interpolation frequency. Two similarly programmed frequency dividers are employed to produce the required interpolation frequency shift. One frequency divider determines the harmonic of the primary reference frequency on which the controllable oscillator is to be phase-locked and the other frequency divider divides the value of the interpolation frequency by an amount equal to the harmonic number of the selected harmonic in the first harmonic spectra.

The above method is explained in further detail by specific reference to the elements shown in FIG. 1. A primary reference frequency $f_1$ is generated by a crystal controlled oscillator 12. The spacing between adjacent harmonics of the primary reference signal frequency represent the largest decade steps permitted.

The remainder of the system may be conveniently considered in two separate parts. The first part provides a method of phase-locking the output signal frequency $f_o$ on line 14 to a secondary reference signal frequency $f_1$* generated (to be described) by the second part. The secondary reference signal frequency is equal to the primary reference frequency signal displaced (in a manner to be described) by the required interpolation frequency shift.

The output signal on line 14 is generated by a voltage controlled oscillator 16. Oscillator 16 is phase-locked to the secondary reference signal frequency $f_1$* present on line 18.

The signal on line 18 is directed to a conventional pulse generator 20, via line 22. The pulse generator 20 is preferably a multi-vibrator circuit or a schmitt-trigger followed by a pulse sharpening circuit, both of which are conventional in the art. Pulse generator 20 transforms the signal on line 18 into a harmonic rich pulse train having a fundamental frequency $f_1$*. The harmonics in this pulse train form a first harmonic spectrum.

The pulse train signal from pulse generator 20 is fed to a first pulse mixer 24. The pulse mixer 24 also receives a signal from amplifier 28 via line 30. The signal from amplifier 28 is derived from the output signal of oscillator 16 via lines 32, 34. The primary purpose of amplifier 28 is to isolate oscillator 16 from pulse mixer 24 to prevent detuning the oscillator. In addition, pulse mixer 24 is controllable (in the sense of being enabled or inhibited) by a signal on line 36 generated by a frequency selective gate, generally indicated by numeral 38 (to be described). Unless an appropriate signal is generated by gate 38 pulse mixer 24 remains inhibited.

Enabling or inhibiting pulse mixer 24 may be accomplished by conventional means familiar to those skilled in the art. For example, pulse mixer 24 may be a balanced or unbalanced diode mixer in which the diodes are normally biased to an 'OFF' condition unless gate 38 generates an appropriate signal on line 36. Alternatively, the signal from gate 38 can be used to enable amplifier 28 which in this case would normally be inoperative thereby preventing the appearance of a signal on line 30.

When the signal on line 36 enables pulse mixer 24, the mixer output signal is directed to a low pass filter 40 via line 42. The output signal from filter 40 is rectified and adjusted in level by conventional means (not shown). The resulting slowly varying DC level is fed via line 44 to a hunting oscillator 48 and then by means to be described via line 50 to a frequency control system 46 which is part of oscillator 16. Frequency control system 46 is conventional and known to those skilled in the art. For example, the frequency control system may be one of the known varactor diode control systems and may involve the tuning of related circuits (not shown) as well as oscillator 16.

A hunting signal is also injected into frequency control system 46 via line 50. This signal is typically a 50 to 100 cycle per second periodic saw-tooth voltage generated by hunting oscillator 48. The hunting signal when applied to the frequency control system 46 of oscillator 16 causes this oscillator to sweep through its frequency range. The hunting action continues until the output frequency $f_o$ of oscillator 16 is phase-locked on the selected harmonic in the first harmonic spectrum generated by pulse generator 20. Once a positive phase-lock has occurred, hunting oscillator 48 is inhibited by the presence of the signal on line 44. While oscillator 16 is phase-locked to the selected harmonic of $f_1^*$, frequency selective gate 38 will produce an output signal on line 36 thereby enabling pulse mixer 24. If the phase-lock is lost or a different output frequency is selected, the gate signal on line 36 temporarily disappears thereby inhibiting mixer 24 and allowing the hunting action to resume until a phase-lock is reacquired on the same harmonic of $f_1^*$ in the first case or on a new harmonic of $f_1^*$ in the latter case.

The rate at which hunting oscillator 48 sweeps the frequency of oscillator 16 across its frequency range must be controlled to allow sufficient time for a positive phase-lock to occur. The precise sweep rate depends on the overall control loop characteristics of the frequency synthesis system since a finite capture time is required due primarily to the time constant of frequency selected gate 38 and filter 40. The circuit criteria required to design a stable phase-lock loop are well known to those skilled in the art.

In the system described thus far the conditions required for a positive phase-lock repeat for each harmonic of the secondary reference frequency $f_1^*$ present in the first harmonic spectrum generated by pulse generator 18. The precise method employed to ensure that a phase-lock on the desired harmonic of $f_1^*$ will occur is now described.

Two signals, one derived in part from amplifier 54 and one from a second pulse generator 56 (to be described), are directed to gate 38 via line 52. Amplifier 54 is coupled to oscillator 16 via lines 34 and 58. The signals from amplifier 54 and a pulse generator 56 are coupled to pulse mixer 60 via lines 62 and 64 respectively.

An auxiliary controllable oscillator 66 is coupled to pulse generator 56 via line 68. The output signal from oscillator 66 has a frequency $f_2$ which is controllable over a limited frequency range by means to be described. Like pulse generator 20, pulse generator 56 produces a pulse train signal having a high harmonic content. The harmonics in this pulse train form a second harmonic spectrum.

The output signal from pulse mixer 60 is a beat signal, between $f_0$ and the nearest harmonic to $f_0$ contained in the second harmonic spectrum on line 64. The beat signal has a variable frequency $f_b$ and when the frequency $f_b$ lies within the passband of frequency selective gate 38, a control signal appears on line 36 enabling pulse mixer 24 as described.

The frequency of the signal generated by oscillator 66 is controlled by a programming system described below. When $f_0$ is coincident with the desired harmonic of $f_1$ the beat frequency $f_b$ from pulse mixer 60 is a frequency $f_4$ ($f_4$ to be defined) which lies within the frequency passband of gate 38. When this condition occurs pulse mixer 24 is enabled by the signal on line 36 generated by gate 38.

Oscillator 66 is programmed by first mixing signals coupled from oscillator 94 and from oscillator 66 on lines 18, 70 and 72 respectively, in a conventional mixer 74. The output signal from mixer 74 appears on line 76 and has a frequency $\pm(f_1^*-f_2)$. It will be apparent to those skilled in the art that either difference frequency may be used in the present frequency synthesis system. Selection may be accomplished by suitably filtering the output signal from mixer 74. In the discussion to follow the difference frequency $(f_1^*-f_2)$ will be assumed.

The signal having a frequency $(f_1^*-f_2)$ on line 76 is coupled to phase discriminator 78. A crystal controlled programming oscillator 80 generates a programming frequency $f_3$ which is directed via line 82 to a programmable frequency divider 84. Divider 84 divides the input frequency $f_3$ by a factor n so that the signal on line 86 has a frequency $(f_3/n)$. Phase discriminator 78 compares the signals $(f_1^*-f_2)$ and $(f_3/n)$ and produces a slowly varying DC output signal on line 88. This signal is proportional to the phase difference between $(f_1^*-f_2)$ and $(f_3/n)$. The signal on line 88 is directed into a second low pass filter 90 having an output on line 92 which provides a signal for a frequency control system 93 which is part of oscillator 66. The control loop comprising elements 66, 74, 78, 80, 84 and 90 is designed to synchronize oscillator 66 to a condition in which $(f_1^*-f_2) = (f_3/n)$.

To ensure a phase-lock condition for the various possible values of n, discriminator 78 may be a combination frequency and phase discriminator. In this case the frequency discriminator portion of discriminator 78 brings $(f_1^*-f_2)$ to a value close to $(f_3/n)$ thereby ensure that both frequencies are within the lock-in range of the phase discriminator portion of discriminator 78.

To ensure an exclusive phase-lock on the nth harmonic of $f_1^*$ various combinations of $f_3$ and division ratios can be used. In a simple configuration the programming frequency $f_3$ is set equal to the frequency $f_4$, and divider 84 is programmed for a division ratio $n$. Thus, the condition required for synchronization of oscillator 66 is $f_1^* - f_2 = (f_4/n)$. When this condition is met the beat frequency $f_b$ is $f_4$ and gate 38 enables pulse mixer 24.

An important consideration in this system is to ensure that $f_0$ cannot be phase-locked on another harmonic of $f_1^*$ within the control range of oscillator 16. In relation to the adjacent harmonics of $f_1^*$, namely $(n \pm 1).f_1^*$ it can be shown that $f_b$ will differ from $f_4$ by by a value $f_4/n$). Consequently, the passband of frequency selective gate 38 must be less than $\frac{1}{2}.(f_4/n)$, for the largest value of n used in order to ensure that the system will not lock onto an adjacent harmonic of $f_1$.

If the passband of gate 38 is designated as $b.f_4$, this represents the frequency range within which $f_b$ must be located in order for gate 38 to enable pulse mixer 24 Assuming that this passband is located symetrically about $f_4$ extending from a frequency $f_4-(b/2)\ .f_4$ to a frequency $f_4 + (b/2)\ .f_4$, the condition $$\frac{f_4}{n} > \frac{b}{2} \cdot f_4$$

must be satisfied to ensure that a phase-lock cannot occur on adjacent harmonics of $f_1^*$. In a practical case, taking into account asymmetry of the passband and a tolerance factor in the frequencies involved the condition may be started as $(f_4/n) \geqslant bf4$, where the harmonic number $n$ relates to the highest harmonic of $f_1^*$ on which a phase-lock is required. For this particular harmonic the ratio $(f_4/n)$ has its lowest value. For example, if $n$ equals 150 than $(b.f_4/f_4)$ must be less than or equal to (1/150).

Another lock-in condition can occur for a substantially different value of $f_0$. If the harmonic number for this alternate lock-in frequency is indicated by $m$ for $f_1^*$ and by $(m+p)$ for $f_2$, then the condition for such a secondary locking point on an image frequency of $f_4$ is, $mf_1^* + f_4 = (m + p)f_2$. Considering also the relationship $f_1^* - f_2 = (f_4/n)$ leads to the result that, $$\frac{m}{n.p} = \frac{f_1^*}{f_4} - \frac{1}{p} - \frac{1}{n}$$

or for $$p = 1,\ \frac{m}{n} = \frac{f_1^*}{f_4} - 1 - \frac{1}{n}.$$

This equation indicates that a secondary lock-in frequency will be more remote for higher values of $(f_1^*/f_4)$ which in turn implies lower values of $f_4$. However, decreasing $f_4$ results in a narrower passband for gate 38 which in turn results in a relatively longer lock-in time and consequently requires a reduced hunting rate. For most practical applications a value of $(f_1^*/f_4)$ lying in the range between 1 and 5 will be satisfactory. This provides protection against a secondary lock-in for a frequency range of more than 3:1 which represents a practical goal.

The remaining elements shown in FIG. 1 are employed to generate the secondary reference signal frequency $f_1^*$. As described above this signal contains the required interpolation frequency shift. The secondary reference signal frequency is generated by a controllable oscillator 94. Signals having a frequency $f_1$, generated by oscillator 12, and a frequency $f_1^*$, generated by oscillator 94, are directed via lines 96 and 97 respectively to a conventional mixer 100. The difference frequency $f_1^* - f_1$ generated by mixer 100 is directed to phase discriminator 102 via line 104. Phase discriminator 102 compares the signal on line 104 with a signal on line 106 from a programmable frequency divider 108. The programmable frequency divider is programmed to divide by the factor $n$. The interpolation frequency $f_i$ is introduced on line 110. Phase discriminator 102 produces an output signal on line 112. The signal on line 112 has an amplitude and polarity related to the phase difference between the signals on lines 104 and 106, $f_1^* - f_1$ and $(f_i/n)$ respectively. The signal on line 112 is fed to a low pass filter 114 which suppresses unwanted harmonics and provides a control signal on line 116 to operate a frequency control system 95 in oscillator 94.

Thus, the frequency of oscillator 94 is brought to a phase-lock condition whereby $f_1^* - f_1 = (f_i/n)$ or $nf_1^* = nf_1 + f_i$. The harmonic $n$ of frequency $f_1$ on which $f_0$ is phase-locked is determined by frequency dividers 84 and 108 both of which are programmed to divide by the same factor. The interlock between each divider is indicated in FIG. 1 by switches 118 and 120 and dotted line 122. Thus, oscillator 16 is phase-locked on a frequency $n.f_1^*$ which is a combination of the selected harmonics of $n.f_1$ plus the required interpolation frequency $f_i$.

The functions of programmed frequency dividers 84 and 108 can be shared in a single frequency divider (not shown). To accomplish this, the input and output circuits of the single divider are periodically switched thereby enabling the divider to be shared. While the input to the single divider is connected to line 82, its output is connected to line 86. This provides a required input for phase discriminator 78. When the input of the single divider is connected to line 110 the output of the divider is connected to line 106 which is coupled to phase discriminator 102. Using a single switched frequency divider requires that phase discriminators 78 and 102 be of the sample-and-hold type.

The periodic switching rate is chosen to ensure a sufficient number of cycles of the divider output signal appear for each input-output connection. This is a necessary requirement for the proper operation of each phase discriminator when it is connected to the divider. After each switch-over operation the single frequency divider is reset to its start condition.

The signal on line 18 may be generated in another manner which avoids the need for phase discriminator 102. in this case a signal having a frequency $f_1$ is mixed in a conventional mixer with a signal having a frequency $(f_i/n)$. The mixer output signal is then passed through a filter which rejects all of the frequencies except the upper image frequency $f_1 + (f_i/n)$. This signal is then directed to line 18.

In the system described above, in relation to FIG. 1, the interpolation frequency $f_i$ has a value which varies from relatively low values to values approaching $f_1$. In practical terms this represents a relatively wide frequency range and as such can lead to complications in a design of phase discriminator 102. For this reason it is preferable to employ an interpolation frequency $f_i + f_1$ on line 110 instead of $f_i$. This being the case the only change required is programming programmable frequency dividers 108 and 84 to divide by a factor $(n-1)$ rather than $n$. Thus, when $f_0$ is phase-locked on the nth harmonic of $f_1$, it is also phase-locked to the $(n-1)$th harmonic of $f_1$*. Therefore $(n-1).f_1^* = nf_1 + f_i$ and $f_0 = nf_1 + f_i$. This is exactly the result previously expressed.

A number of alternate methods exist for generating the required interpolation frequencies which being familiar to those skilled in the art are not described herein. In frequency synthesis systems employing pulse synchronized oscillators, it is advantageous to span a frequency range of 2 decades in addition to a frequency shift equal to one step of the largest step interval using a single phase-locked oscillator. Consequently, each interpolation oscillator must cover a range of 100 to 200 times its fundamental frequency or 99 to 199 times its fundamental frequency if the frequency shift produced by a further interpolation system is included. While the interpolation oscillator concerned covers a range of approximately 100:1 for interpolation purposes the relating programming section will still be in decade steps. Consequently, the overall frequency selection will appear as a multi-digit decimal number.

Figure 2:
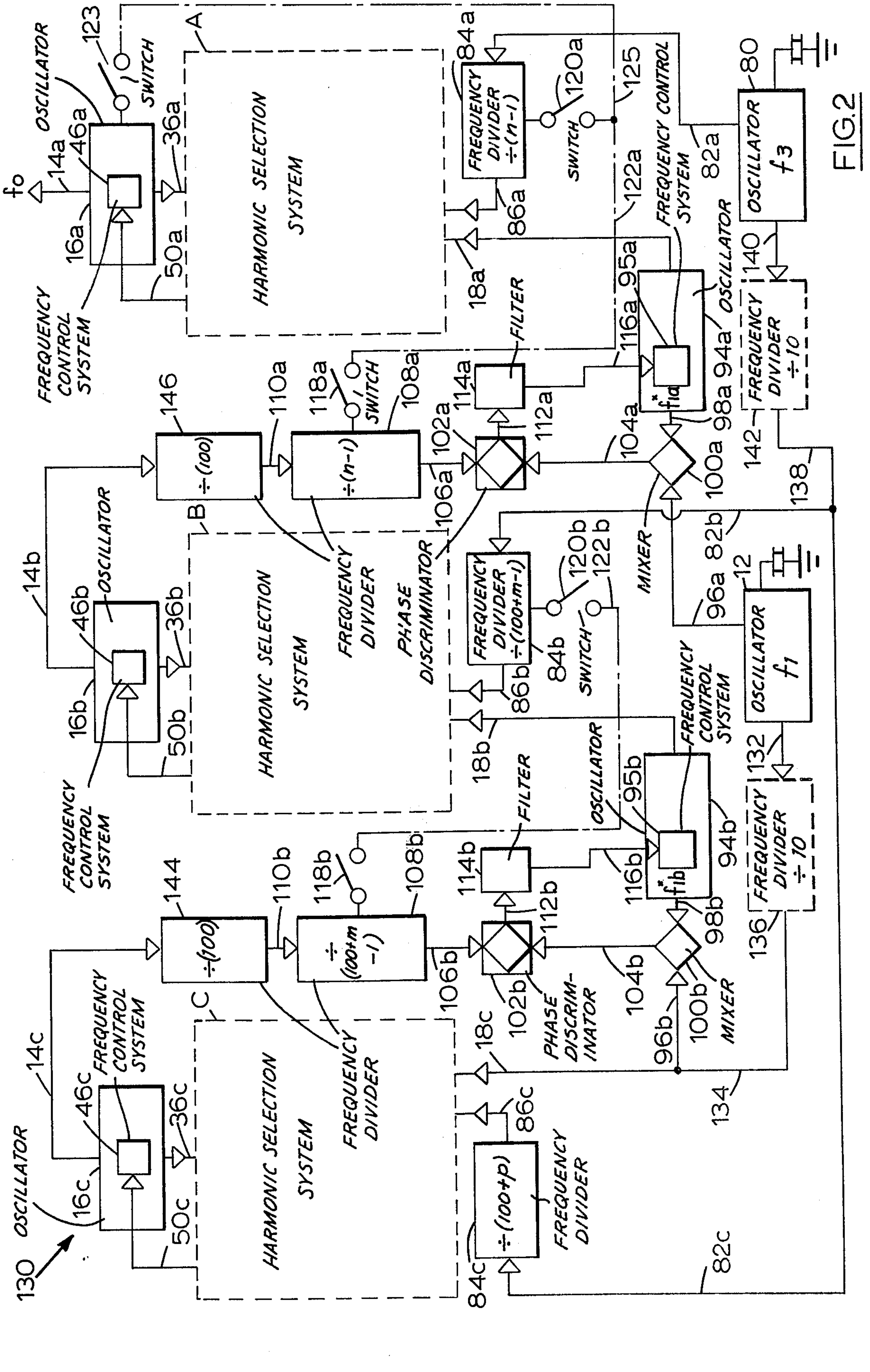
FIG. 2 is a block diagram of a multi-decade frequency synthesizer based on successive repetitions of the frequency synthesis element shown in FIG. 1.

Reference is now made to FIG. 2 which shows at 130, in block diagram form, a multi-decade frequency synthesizer. The frequency synthesizer is based on successive repetitions of the system shown in FIG. 1. A signal having a frequency $f_1 + f_i$ is employed as an interpolation frequency and programmable dividers 108 and 84 set to divide by a factor of $(n-1)$ rather than n. Since each harmonic selection system A, B, and C is identical to the system shown in FIG. 1, the internal elements comprising each system are not shown and identical external elements are identified by a letter subscripted form of a previously used reference numeral. In addition, it will be appreciated by those skilled in the art that each harmonic selection system and its associated elements, although identical in form and function may differ in the respect that each harmonic selection system can have different input and output frequency since each contributes a specific interpolation shift. In this case filters and other frequency sensitive elements must be appropriately adjusted to operate over the required range of frequencies.

The output signal $f_0$ of the multi-decade synthesizer shown in FIG. 2 appears on line 14*a*. $f_0$ is phase-locked to the $(n-1)$th harmonic of secondary reference frequency $f_{1a}$* which in turn is phase-locked on the nth harmonic of the primary reference frequency $f_1$ (generated by oscillator 12) plus the interpolation frequency $f_i$. Harmonic number $n$ is determined by divider 84*a* which is programmed to divide the gate enable frequency $f_4$ on line 82*a* by a factor $(n-1)$. Harmonic selection is accomplished, as previously described, by comparing the output signal $f_{1a}^* - f_1$ from mixer 100*a* with $$\frac{1}{n-1}$$

times the interpolation frequency $(f_1 - f_i)$ which is produced by frequency divider 108*a*. The control signal on line 116*a* phase-locks oscillator 94*a* to a frequency which satisfies the condition, $$f_{1a}^* - f_1 = \frac{f_1 + f_i}{n-1}.$$

Consequently, $(n-1)f_{1a}^* = nf_1 + f_i$.

The interpolation frequency $f_1 + f_i$ is generated in a manner now described. Frequency $f_1$ is coupled via lines 132, 134, and line 20*c* to harmonic selection system C. Harmonic selection system C is programmed for an interpolation step $(100 + p)$, where $p$ (the harmonic number for the smallest interpolation step in the system) is an integer between 0 and 99, by means of divider 84*c* and gate enable frequency $f_3$. The gate enable frequency $f_3$ is generated by oscillator 80 and is set equal to the frequency $f_4$ (previously defined). The signal from oscillator 80 is coupled to divider 84*c* via lines 82*c*, 138 and 140 Consequently, the output of oscillator 16*c*, $f_0c$ is phase-locked to a frequency $(100 + p).f_1$.

The output signal from oscillator 16*c* is directed via line 14*c* to a fixed frequency divider 144 which divides the output signal frequency by 100. The output of divider 144 is further divided in programmable divider 108*b* by a factor of $(100 + m - 1)$, where $m$ is the harmonic number of the next highest interpolation step and has a value between 1 and 99. Thus, the output signal on line 106*b* has a frequency $$\frac{(100 + p).f_1}{100.\ (100+m-1)},$$

which represents the shift in frequency of oscillator 94*b*. This frequency is defined as $f_{1b}$*. In relation to primary reference frequency $f_1$, the frequency $f_{1b}$* is phase-locked, in the manner previously described, by mixer 100*b*, phase 102*b* and filter 114*b* to a condition where $f_{1b}^* - f_1 =$ $$\frac{(100 + p).f_1}{100.\ (100+m-1)}.$$

For the second interpolation step $m$, harmonic selection system B is programmed by divider 84*b* which divides $f_4$ by the factor $(100+m-1)$. As a result, oscillator 16*b* is phase-locked to a frequency $(100+m-1).f_{1b}$*. Upon simplification the frequency of oscillator 16*b* is equal to the frequency $(100+m+(p/100)).f_1$. Frequency dividers 108*b* and 84*b* must always divide by the same factor, consequently they must be simultaneously programmed. This is indicated by switches 118*b* and 120*b* and dotted line 122*b* in FIG. 2.

The output signal from oscillator 16*b* appears on line 14*b* and is coupled to a fixed frequency divider 146 which divides by a factor of 100 resulting in a signal on line 110*a* having a frequency $$f_1\left(1 + \frac{m}{100} + \frac{p}{10000}\right).$$

The signal on line 110*a* represents the interpolation frequency $f_1 + f_i$ described above. Thus, $f_i$ is equal to $$f_1.\ \left(\frac{m}{100} + \frac{p}{10000}\right).$$

As previously discussed $f_0$ is produced by harmonic selection system A and is equal to $nf_1 + f_i$. Therefore $f_0$ equals $$\left(n + \frac{m}{100} + \frac{p}{10^4}\right)f_1.$$

Frequency dividers 110*a* and 84*a* must be simultaneously programmed since both must divide by the same factor $(n-1)$. This is shown in FIG. 2 by switches 118*a* and 120*a* and line 122*a*. Switch 123 and line 125 are used to indicate that the output frequency produced by oscillator 16*a* can be varied. However, when this is done switches 118*a* and 120*a* must also be activated.

In the above system oscillators 94*a* and 94*b* operate over a relatively limited frequency range, the location of which is clearly defined in relation to the frequency $f_1$, which results in a single unambiguous phase-lock system. The output of oscillators 16*b* and 16*c* can be varied in frequency over a frequency range with a ratio in the order of 2 to 1. This can be accomplished by a hunting oscillator referred to with reference to FIG. 1.

Oscillators 16*b* and 16*c* cover an identical frequency range which is quite similar to that covered by oscillator 16*a*. In some applications the frequencies employed must be relatively high due to circuit design considerations. If this is the case, the primary reference frequency supplied to harmonic selection systems B and C can be reduced by a factor of 10. This is accomplished by the fixed divider 136 which divides the output frequency of oscillator 12 by factor of 10. Consequently, the interpolation system operates at a frequency lower by an order of magnitude than in the system described above. In accordance with this arrangement the gate frequency $f_4$ supplied by oscillator 80 must be reduced by a factor of 10 by fixed divider 142. Because the interpolation system is now operating at ten times reduced frequency, divider 146 must be changed to divide by a factor of 10 rather than 100. This results in signals being directed to programmable divider 108*a* which are identical to those in the original system. Employing a lower frequency in the interpolation system has the advantage of allowing a more economical design.

An even more practical arrangement in a multidecade frequency synthesizer is to employ continuously operating interpolation dividers for each harmonic selection system and time share one common divider for the programming function of each system. This is done by periodically connecting, in a predetermined scanning sequence, a common programmable frequency divider to each harmonic selection system. The time sharing concept is based on the realization that while the function of the interpolation frequency dividers is basically a continuous one the programming dividers are only required on a continuous basis until a phase-lock on the selected harmonic has occurred. Subsequent to a phase-lock, the programming dividers have no further function except to ensure that in case any change takes place it will be corrected or if the programming is altered by the selection of a new output frequency that this change is actually performed. These operations can be performed adequately be a periodic sampling process instead of a continuous one. In addition, a time sharing scheme would preferably incorporate an arrangement which ensures that when the programming of a harmonic selection system is changed, the programming divider immediately switches to that particular system until the change has been carried out after which repetitive scanning action is resumed.

Figure 3:
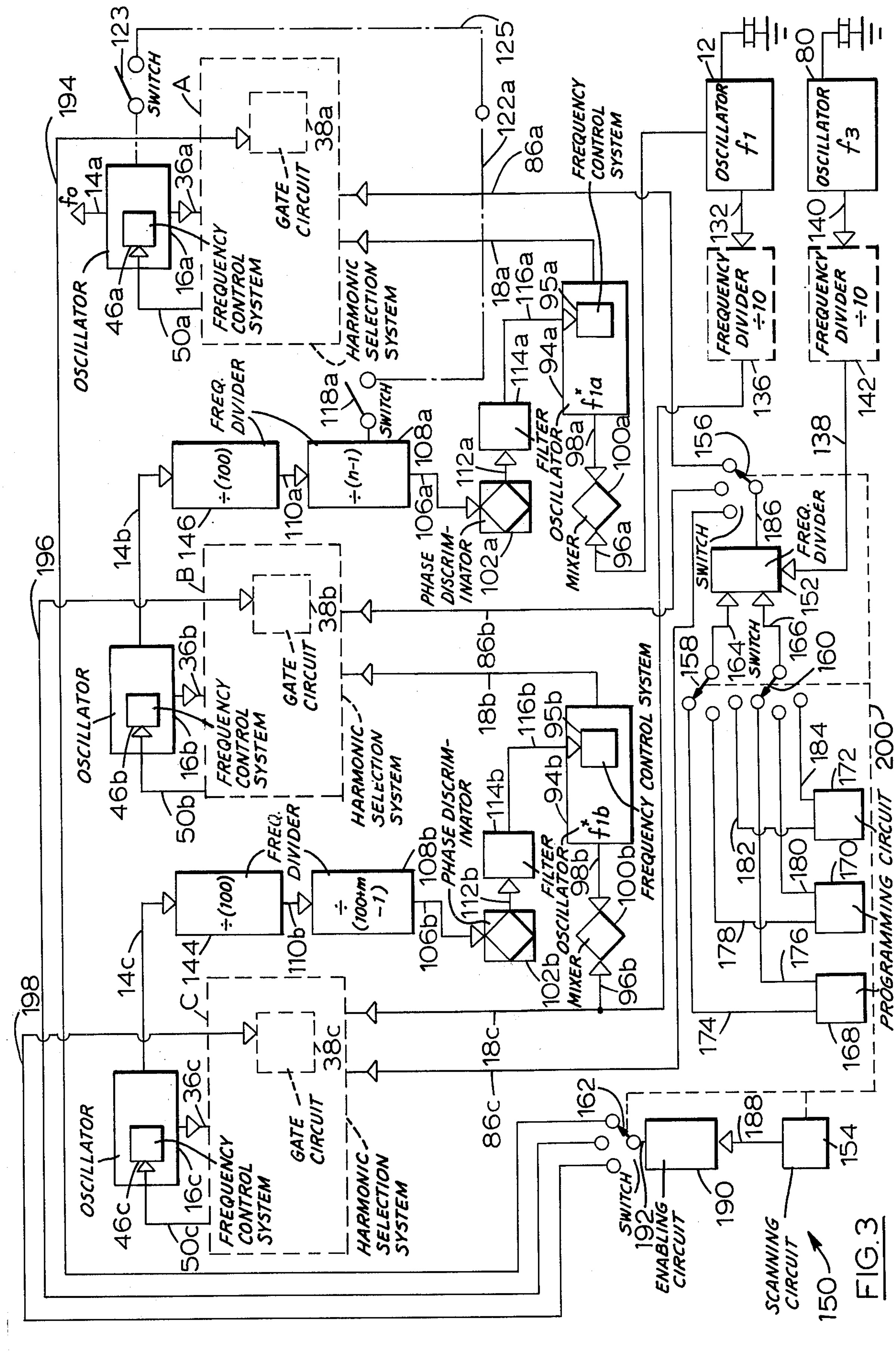
FIG. 3 is a block diagram of an embodiment of the multi-decade frequency synthesizer shown in FIG. 2, employing a time sharing scheme.

Accordingly, another embodiment of the present invention, shown in block diagram form in FIG. 3 at reference numeral 270, involves the modification of a multi-decade frequency synthesis system shown in FIG. 2 to include a time sharing arrangement for the programming frequency dividers. In practice both the time sharing and scanning functions would be performed electronically, however, for reasons of simplicity mechanical switches are shown.

Programming frequency dividers 84*a*, 84*b* and 84*c* (see FIG. 2) are replaced by a single common programming frequency divider 152. As was the case with the individual programming frequency dividers, programming frequency divider 152 receives a signal from oscillator 80 via line 138. A scanning circuit 154 operates scanning switches 156, 158, 160 and 162 causing each switch to move sequentially in synchronism so that the signal lines are repeatedly switched from connections relating to each of the harmonic selection systems A, B, and C. In addition, programming lines 164 and 166 associated with divider 152 are successively interconnected to programmers 168, 170 and 172 by switches 158 and 160 via lines 174 and 176, 178 and 180 and 182 and 184 respectively. The programmers change the dividing ratio of programming frequency divider 152 when it is switched to each harmonic selection system. At the same time the output of frequency divider 272 on line 186 is coupled by switch 156 to lines 86*a*, 86*b* and 86*c*.

Scanning circuit 154 is also coupled via line 189 to an element 190. Element 190 generates an enabling signal on line 192. This enabling signal is sequentially switched by switch 162 to lines 194, 196 and 198 which direct the enabling signal to the frequency selective gates 38*a*, 38*b* and 38*c* (see FIG. 1) in harmonic selection systems A, B, and C, respectively.

When the enabling signal is absent at the input of any particular gate 38*a*, 38*b* or 38*c*, the gate will generate a gate enable signal on lines 36*a*, 36*b* or 36*c* (refer to FIG. 1). However, when an enabling signal is present, the gates are returned to their normal mode and will produce a gate enable signal on lines 36*a*, 36*b* or 36*c* only when the input signal on lines 52*a*, 52*b* or 52*c* corresponds to the required gate enable frequency $f_4$. If this is not the case the gate will break the phase-lock and hunting will resume until a phase-lock on the proper harmonic frequency for the harmonic selection system concerned occurs. The time sharing frequency synthesizer provides circuitry (not shown) to interrupt the operation of the scanning system upon the initiation of hunting in any harmonic selection system. The scanning system remains interrupted until a phase-lock occurs in the harmonic selection system, at which time the scanning operation is resumed.

As previously described, the scanning system is arranged so that the scanning circuitry makes the necessary connections to the particular harmonic selection system in which the programming has been changed. Hunting action in that particular harmonic selection system will continue until a phase-lock on the required harmonic related to the newly programmed output frequency occurs at which time normal scanning is resumed.

It will be obvious to those skilled in the art that the time sharing scheme described can be extended to include the auxiliary controlled oscillator and related mixer and frequency discriminator circuits and may also include part of the pulse mixer circuit. In this system the input for the related interpolation frequency dividers and the output of the respective auxiliary frequency oscillators to their respective pulse generators are switched over by the scanning system.

In the above description it has been assumed that the frequency $f_4$ is the same for all harmonic selection systems, however this is not always the case. The programming system may include a number of different programming frequencies which are switched between the various harmonic selection systems as required.

The dotted line 200 between the scanning circuit 154 and switches 156, 158, 160 and 162 indicates that all of these switches are switched in synchronism. In addition, although not shown in FIG. 3, interpolation dividers 108*a* and 108*b* must be interlocked with programmers 168 and 170 respectively in order to correctly program the related dividers when a new frequency selection is made.

Figure 4:
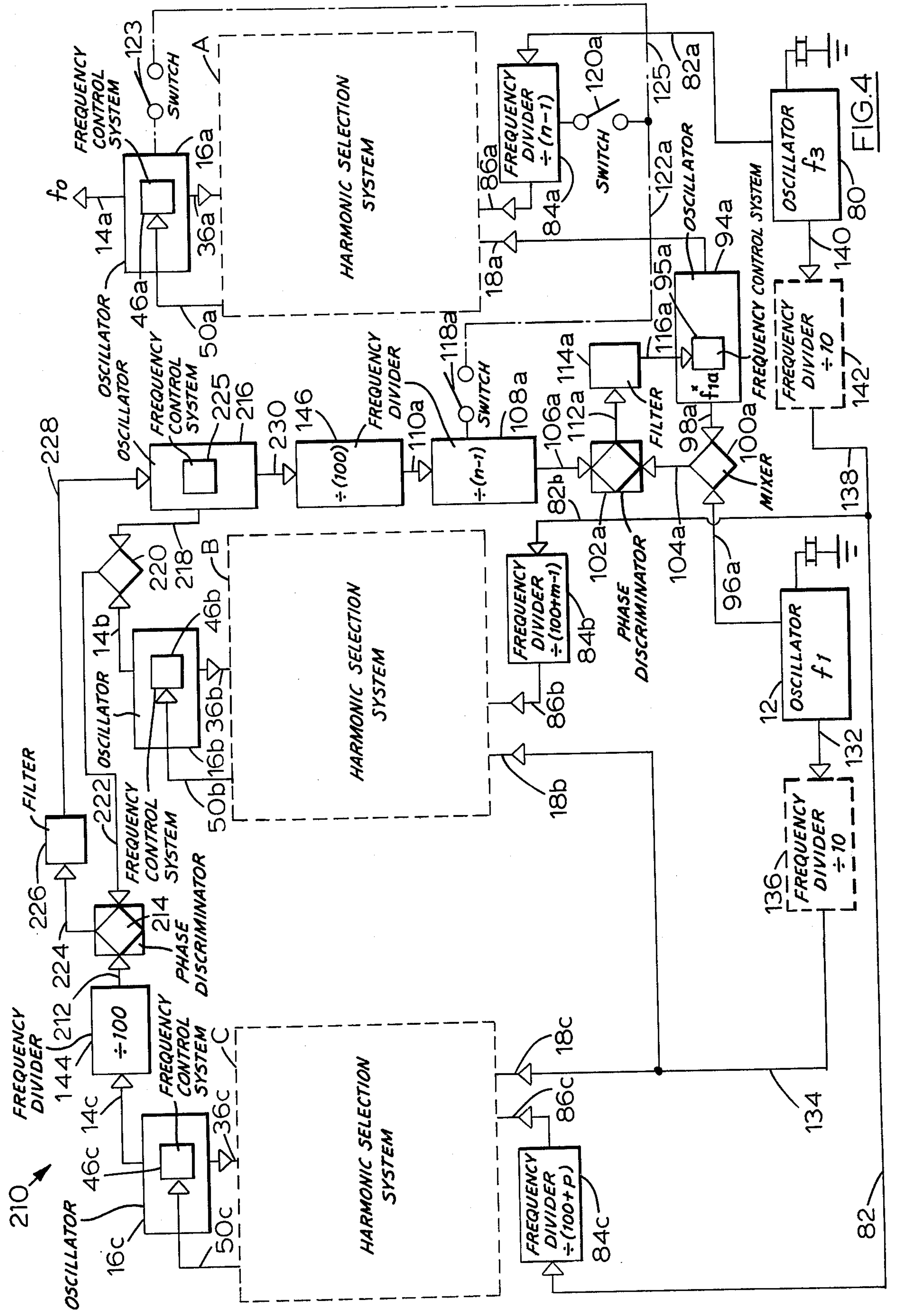
FIG. 4 is a block diagram of another embodiment of the multi-decade frequency synthesizer shown in FIG. 2.

Reference is next made to FIG. 4 which shows a multi-decade frequency synthesizer, indicated generally by numeral 210. This system is somewhat simpler than that shown in FIG. 2 inasmuch as one less programmed frequency divider is employed. Harmonic selection systems B and C are coupled to a common primary reference frequency having a frequency $f_1$ (or $(f_1/10)$ as previously described). As before, this frequency represents the basic step frequency in the system. Consequently, controlled oscillator 16*c* is phase-locked on the $(100+p)$th harmonic of the frequency $f_1$ while controlled oscillator 16*b* is phase-locked to the $(100+m-1)$th harmonic of the frequency $f_1$.

The output of oscillator 16*c* is coupled via line 14*c* to fixed frequency divider 144. Frequency divider 144 generates an output signal having a frequency $(1 + (p/100)f_1$. This signal is fed via line 212 to phase discriminator 214. The auxiliary controlled oscillator 216 tracks the output frequency of oscillator 16*b* but is offset to a slightly higher frequency. The output signals from oscillator 16*b* and from oscillator 216 are fed via lines 14*b* and 218 respectively to mixer 220. The difference frequency produced by mixer 220 is fed via line 222 to phase discriminator 214 where it is compared with the signal on line 212. The phase discriminator output signal on line 224 is fed to a low pass filter 226. The filter output signal on line 228 provides a control signal for a frequency control system 225 in oscillator 216 phase-locking oscillator 216 to a frequency $(100 + m + (p/100)f_1$.

The output from oscillator 216 is fed via line 230 to fixed frequency divider 110*a* where it is divided by a factor of 100 (or 10 as previously described). Consequently, the output frequency of divider 146, appearing on line 110*a* has a frequency $$\left(1 + \frac{m}{100} + \frac{p}{100}\right) f_1$$

which is the required interpolation frequency for harmonic selection system A. The remainder of the system is identical to that described with reference to FIG. 2. The output frequency $f_o$ on line 14*a* equals $$\left(n + \frac{m}{100} + \frac{p}{10000}\right) f_1.$$

The frequency of oscillator 216 is maintained at a value slightly higher than the frequency of oscillator 16*b*. This creates the possibility of oscillator 216 phase-locking on a lower image frequency of oscillator 16*b* which differs only slightly in value from the desired upper image frequency. To avoid the complications involved in closely tracking oscillators 16*b* and 216, phase discriminator 214 may be an image-selective phase discriminator. This type of phase discriminator is well known to those skilled in the art and permits a phase-lock on either the upper or lower image frequency as compared with the input reference frequency to the mixer.

A further modification (not shown) directs a signal derived from the control signal on line 46*b* to oscillator 216. This signal is used for course tuning oscillator 216. Thereafter, a hunting system (not shown) associated with oscillator 216 would provide hunting over a limited frequency range to ensure an ultimate phase-lock.

Figure 5:
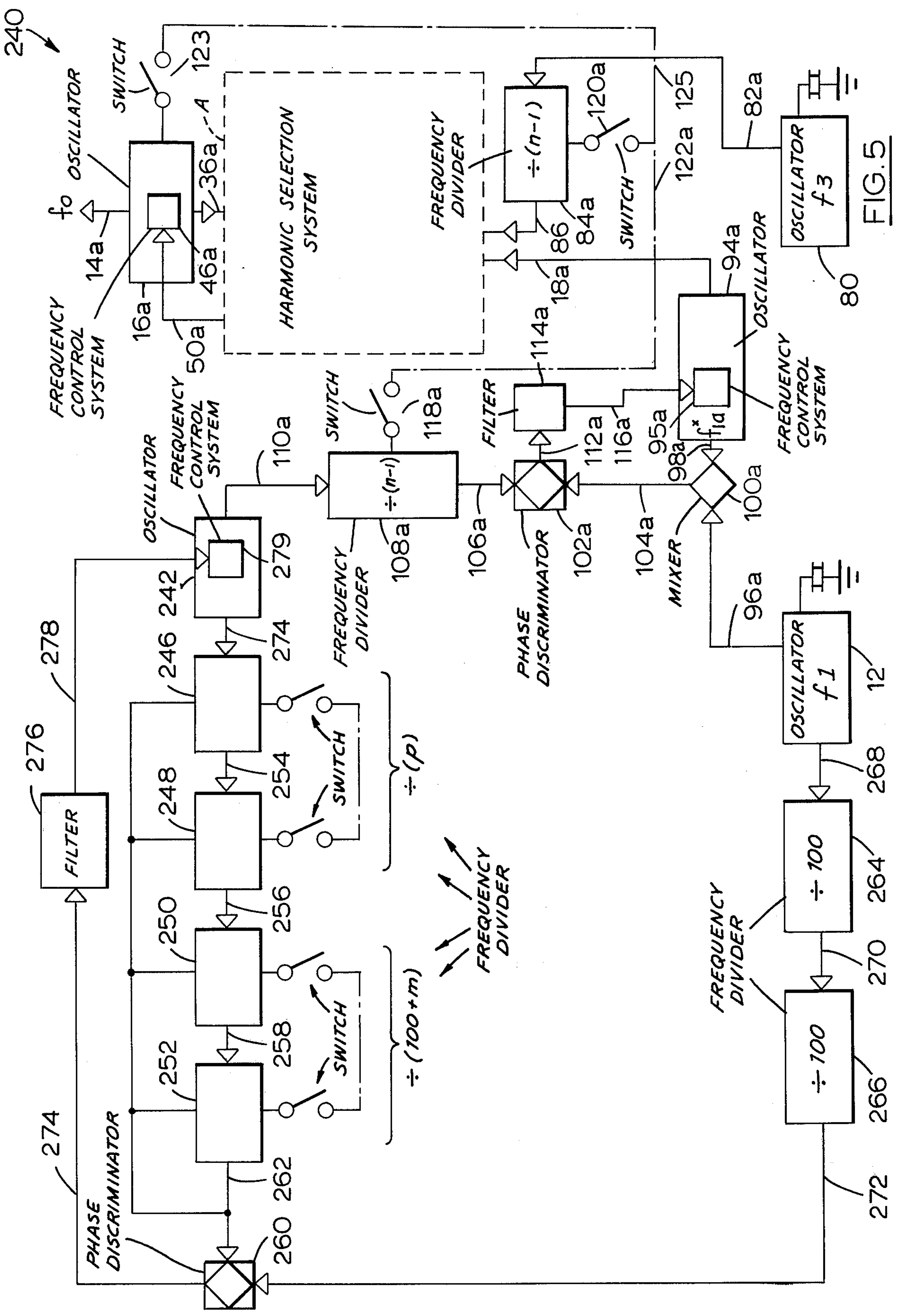
FIG. 5 is a block diagram of a multi-decade frequency synthesizer comprising the basic frequency synthesis element shown in FIG. 1 used with a gated divider interpolation system.

Reference is now made to FIG. 5 which shows at reference numeral 240 a multi-decade frequency synthesizer which combines the frequency synthesis system shown in FIG. 1 with interpolation means using a gated divider system as outlined in the introductory remarks concerning multi-decade frequency synthesizers. As previously described the main disadvangates associated with the gated divider frequency synthesizer are the requirements for high speed counters and signal gates when high output signal frequencies are involved and reduced phase stability in the output signal frequency of the system. The latter disadvantage is particularly severe when high multiplication factors are required. The use of a gated divider system in the interpolation portion of the frequency synthesis system shown in FIG. 1 can substantially reduce these disadvantages.

In FIG. 5 the output signal from controllable oscillator 242 is directed via line 274 to four serially connected gated decode frequency dividers. Frequency dividers 246 and 248 divide by factor $p$ which represents the smallest interpolation step and frequency dividers 250 and 252 divide by a factor $(100 + m)$ which represents the largest interpolation step. The frequency dividers are interconnected via lines 254, 256 and 258 respectively. Each divider is provided with gating circuitry (not shown) which allows the frequency divider to absorb a fixed number of input pulses before being bypassed by the gating circuitry. At the end of one complete cycle a trigger pulse generated by the appearance of a signal on line 262 is directed to each of the frequency dividers. The trigger pulse resets the entire frequency divider chain. The output of divider 252 feeds a phase discriminator 260 via line 262.

The primary reference frequency $f_1$ is divided by a factor of 10,000 by fixed frequency dividers 264 and 266. Divider 264 receives an input signal of frequency $f_1$ via line 268 and is coupled to divider 266 via line 270. This provides a signal on line 272 having a frequency equal to $f_1/10,000$ which represents the smallest interpolation step.

The output from divider 266 feeds phase discriminator 260 via line 272 and the output signal from phase discriminator 260 on line 274 is directed to filter 276. The output signal from filter 276 is coupled to oscillator 242 via line 278. The signal on line 278 operates the frequency control system 279 in oscillator 242 to establish the output frequency of this oscillator at a frequency equal to $f_1.(1 + 100m + (p/10000)$. As described above this frequency represents the required interpolation frequency. The remainder of the system operates identically to the system shown in FIG. 1.

Phase modulation of the output signal $f_o$ has a maximum value which is equal to the phase modulation which occurs in oscillator 242. This is 100 times less than a comparable gated divider frequency synthesizer with an output frequency comprising the full six decimal places.

The low frequency used in the interpolation system will result in a relatively long selection time when a new output frequency is selected. However, the selection time can be reduced by altering divider 266 to divide by 10 rather than 100. In this case, controlled oscillator 242 will vary over a frequency range of $10.f_1$ to $20.f_1$. Hence oscillator 242 must be followed by a fixed frequency divider which divides by a factor 10 (not shown) so that the signal on line 110*a* will have the proper frequency. Using this arrangement, the maximum frequency of oscillator 242 is still relatively low while the phase modulation in the output signal on line 14*a* is reduced by a factor of 1000 over a comparable full gated divider frequency synthesis.

It will be obvious to those skilled in the art that the aforementioned interpolation system represents only one of the possible systems that can be employed. Due to the flexibility of the basic frequency synthesis system provided by the present invention, a wide choice of division ratios and oscillator frequencies are available in order to maximize both the performance and the economy of the system.

The problem of phase modulation in the output signal frequency $f_o$ associated with the gated divider frequency synthesizer shown in FIG. 5 arises from the fact that the output signal from the gated frequency divider chain while having a relatively low frequency must have a relatively wide lock-in range for satisfactory operation. This requires a comparatively long time constant in the interpolation oscillator control loop which in turn results in a reduction in the output signal phase stability. The operation of the gated divider frequency synthesizer may be improved both in terms of increased phase stability and reduced lock-in time by the circuitry shown in FIG. 6 at reference numeral 300. Because the additional circuitry will be described in relation to the gated divider frequency synthesizer shown in FIG. 5 parts of FIG. 5 are reproduced in FIG. 6 for convenience.

Figure 6:
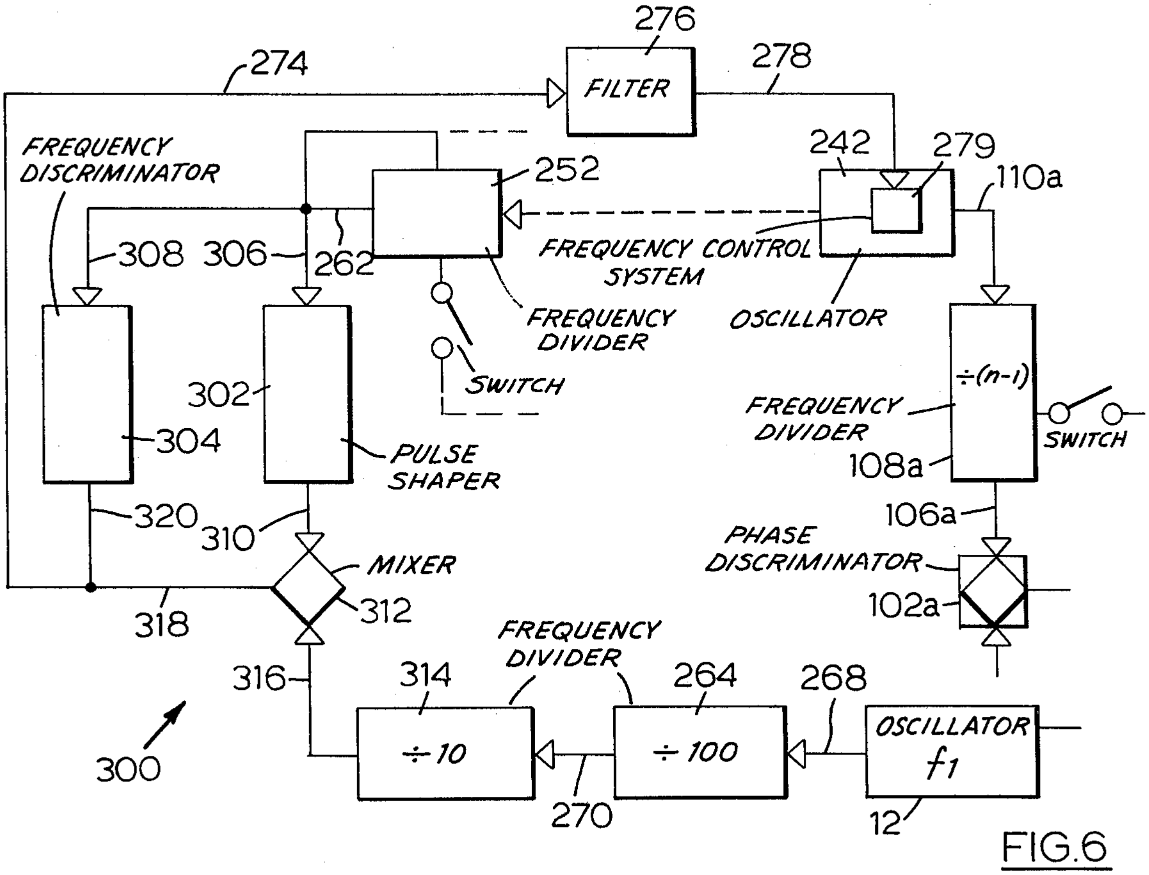
FIG. 6 is a partial block diagram of the multi-decade frequency synthesizer shown in FIG. 5 including additional components for increasing the phase stability of the multi-decade frequency synthesizer output frequency.

Referring now to FIG. 6, the frequency divider 252 is coupled to a pulse shaping circuit 302 and a fixed frequency discriminator 304 via lines 262, 306 and 262, 308 respectively, Frequency discriminator 304 is tuned to a centre frequency equal to the required output frequency of the gated divider chain when oscillator 242 is in a phase-lock condition. In this case the centre frequency of the frequency discriminator is equal to $f_1/10,000$. Pulse shaper 302 transforms the signal on line 262 to a harmonic rich pulse train having the same frequency as the signal on line 262. The pulse train from pulse shaper 302 is directed via line 310 to a pulse mixer 312.

The primary reference frequency $f_1$ is divided by a factor of 1000 by fixed frequency dividers 264 and 314 and is directed to pulse mixer 312 via line 316.

In pulse mixer 312 the frequency spectra contained in the pulse train on line 310 is mixed with the signal on line 316 which has a 10 times higher fundamental frequency than the signal on line 316. The resulting difference frequency signals are directed via lines 318 and 274 to filter 276.

Frequency discriminator 304 generates a dual polarity DC output signal on line 320 which is combined with the mixer output signal on line 318 and directed along line 274 to filter 276. The portion of the control signal on line 278 which is derived from the frequency discriminator 304 causes the frequency of oscillator 242 to vary so that the output frequency of frequency divider 252 approaches the centre frequency of the frequency discriminator 304. As this frequency is approached the frequency of the signal generated by mixer 312 drops to a value low enough to allow the signal to pass through filter 276 to the frequency control circuitry 279 in oscillator 242. The portion of the control signal on line 278 produced by mixer 312 ultimately causes oscillator 242 to phase-lock on the required interpolation frequency.

The reduction in lock-in time is a result of the characteristics of the feed back control loop including frequency discriminator 304. The use of a frequency discriminator in the control loop permits faster frequency control and hence a reduced lock-in time.

Increased phase stability in the output signal frequency $f_o$ is due to the use of pulse mixer 312 in the control loop. Because the control signal generated by pulse mixer 312 is derived from the 10th harmonic of the gated divider output signal frequency erratic phase modulation in the output of oscillator 242 is reduced by a substantial amount approaching a factor of 10. Furthermore, because the critial phase shift for loop instability is 180° for frequency discriminator feedback and only 90° for phase modulation feedback the use of a frequency discriminator in the feedback control loop allows the cancellation of higher frequency phase modulated signal components than would be possible by using a phase discriminator in the feedback loop.

The phase stability of the gated divider frequency synthesizer may be further improved by increasing the phase stability of the interpolation frequency oscillator. Referring to reference numeral 330 in FIG. 7 (which includes portion of FIG. 5 for clarity) circuitry, in block-schematic diagram form, for improving the phase stability of interpolation oscillator 242 is shown.

To increase the phase stability of interpolation oscillator 242 an additional negative feedback control loop employing a frequency discriminator 332 is employed. The frequency discriminator input signal may be derived from oscillator 242. However, it is preferable that the frequency discriminator input signal have a higher frequency than the frequency of the output signal from the gated frequency divider chain on line 262 (see FIG. 5).

Figure 7:
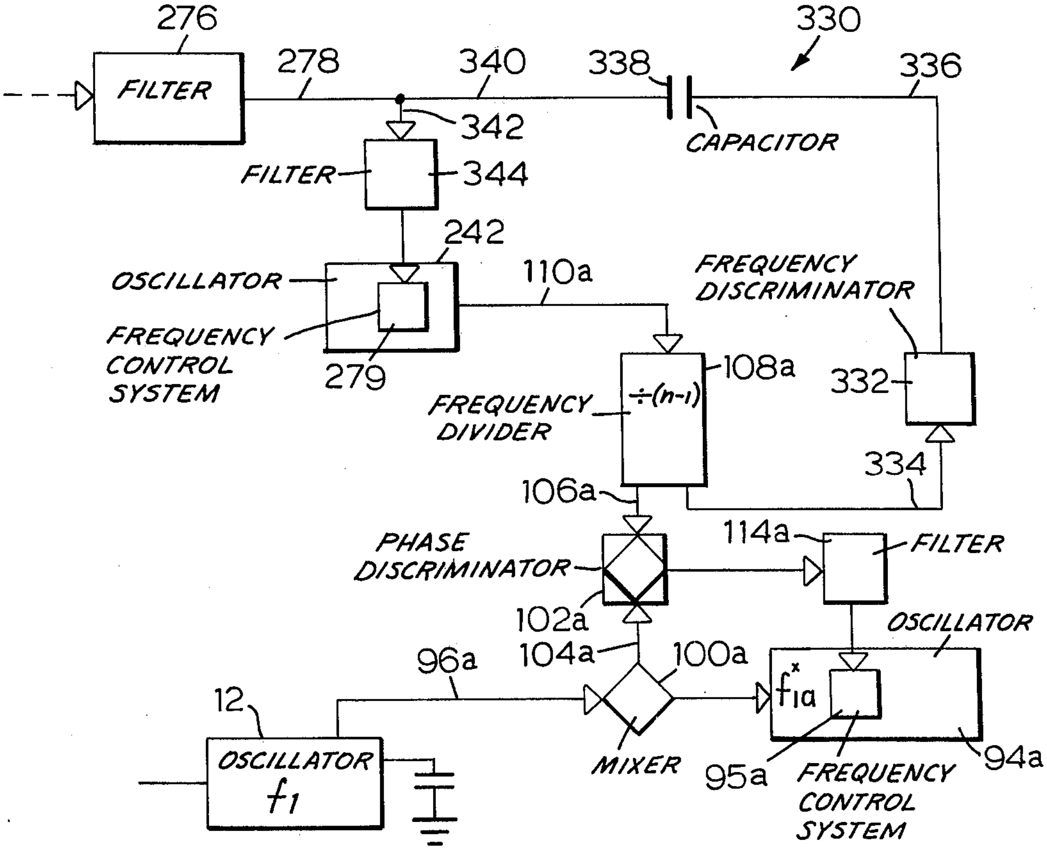
FIG. 7 is a partial block diagram of the multi-decade freqency synthesizer shown in FIG. 5, including further added components to increase phase stability.

In FIG. 7 the input signal for frequency discriminator 332 is derived from the output signal of fixed frequency divider 108*a* via line 332. The output of the frequency discriminator on line 336 is directed via a capacitor 338, lines 340 and 342, and a low pass filter 344 (to be described) to oscillator 242. The signal polarity coupled back to oscillator 242 is selected to provide negative feedback. Frequency discriminator 332 is designed to have a linear transfer characteristic between its input and output over a frequency range which includes the frequency range of the output signal from frequency divider 108*a*.

Referring again to FIG. 5, if we assume that the factor $(100 + m + p)$ is considerably greater than the factor ($n-1$) the output signal frequency on lines 334 and 106*a* will be considerably greater than the frequency of the signal on line 262. As a result, the negative feedback provided by frequency discriminator 332 is operational at considerably higher frequencies than the feedback generated by a phase discriminator 260. The effect is a substantial improvement in the reduction of phase modulating disturbances at the higher frequencies.

The additional feedback circuitry shown in FIG. 7 results in a reduction in the speed of the frequency control loop associated with interpolation oscillator 242. The speed of the frequency control loop is determined by the value of capacitor 338. Capacitor 338 also establishes a lower frequency limit for the feedback from frequency discriminator 322. Consequently, the value of capacitor 338 must be selected to compromise between increased phase stability for oscillator 242 and reduced control loop response and hence reduced locking time. The additional circuitry shown in FIG. 7 can result in a significant reduction in phase modulation in the output signal frequency $f_o$, particularly in relation to phase modulation disturbances at a frequency beyond the cut-off frequency of filter 276.

Filter 344 is a low pass filter having a high frequency cut-off considerably higher than that of filter 276. The purpose of filter 340 is to surpress the spurious frequency components in the output signal from frequency divider 108*a*.

In order to better illustrate the practical potential of the frequency synthesis system according to the present invention, the following numerical example based on the system illustrated in FIG. 4 is provided. The example is then applied to the multi-decade frequency synthesizer shown in FIG. 5.

In this example the frequency synthesizer is to have an output frequency range from 10 MHz to 150 MHz. with frequency selection at intervals of 100 Hz. The primary reference frequency $f_1$ is 1 MHz. This frequency represents the basic step frequency of the frequency synthesizer in this example. The range 10 MHz to 150 MHz can be conveniently divided into 4 sub-ranges of 10 MHz to 20 MHz, 20 MHz to 40 MHz, 40 MHz to 80 MHz and 80 MHz to 150 MHz. Each of these sub-ranges has a frequency range of 2 to 1 with the exception of the highest range which is less than 2 to 1. The selection of the sub-ranges can be effected by a 1 MHz step programming divider which involves frequency dividers 108*a* and 84*a*. The harmonic number $n$ will have values between 11 and 151. This corresponds to ($n-1$) having values from 10 to 150. Consequently, oscillator 16*a* covers the range of 10 to 150 MHz in the basic steps of 1 MHz. Programming for dividers 84*a* and 108*a* is provided by means of an external decade switch which covers the range of 10 to 150 although internally $n$ equals 11 to 151.

The reference frequency used to generate each basic step is supplied by oscillator 12. The output frequency $f_o$ is phase-locked on the required harmonic of a secondary primary reference frequency oscillator 94*a* which equals the frequency $f_1$ shifted by the required interpolation frequency divided by a factor of ($n-1$). For interpolation, the 1 MHz signal generated by oscillator 12 is divided by frequency divider 136 by a factor of 10 resulting in a 100 KHz signal on line 134. This signal is used as the input frequency for harmonic selection systems B and C, each of which covers two decades in frequency. Harmonic selection system C is ultimately responsible for producing the 100 Hz steps and consequently covers the 100th to 200th harmonics of 100 KHz. Thus, oscillator 16*c* covers a range of 10 to 20 MHz in 100 KHz steps.

The external numerical indicator which programs divider 84*c* displays two decimal places each varying from 0 to 9. Internally the programming system associated with harmonic selection system C is programmed for division ratios of 100 to 199. The output of oscillator 16*c* is coupled to frequency divider 144.

Frequency divider 144 divides by a factor of 100 thereby providing an output signal on line 212 varying in frequency from 100 KHz to 200 KHz in 1 KHz steps. Programmable frequency divider 84*b* in association with harmonic selection system B covers division ratios of 99 to 199. As a result, the output frequency of oscillator 16*b* covers a range of 9.9 MHz to 19.9 MHz in 100 KHz steps. The external programmer for frequency divider 84*b* will indicate two decades of frequency using the numerals 0 to 9.

Oscillator 216 provides a signal whose frequency is equal to the sum of the frequencies produced by oscillator 166 and frequency divider 144, covering a frequency range of 10 to 20 MHz in 1000 steps. Briefly reiterating, this is accomplished by mixing signals from oscillators 16*b* and 216 in mixer 220 and feeding the difference frequency on line 222 to a phase discriminator 214. The output of the phase discriminator is fed to filter 226. The filter output signal is used to control the frequency of oscillator 216 to a phaselock condition in which the output signal frequency from mixer 220 is equal to the output signal frequency from divider 144. If phase discriminator 214 is an image-selective phase discriminator, a phase-lock will occur only when the frequency of oscillator 216 is higher than the frequency of oscillator 16*b*.

The output signal of oscillator 216 is coupled to frequency divider 146 which divides by a factor of 10 rather than 100 since dividers 136 and 142 have already divided by a factor of 10. Therefore, the output signal from frequency divider 146 covers a frequency range of 1 to 2 MHz in 100 Hz steps. The output of divider 146 is directed to divider 108*a* which is programmed to divide by the same factor as frequency divider 84*a*. Consequently the output signal from frequency divider 108*a* is a frequency in the range 6.7114 KHz to 222.222 KHz. For proper coincidence between frequency dividers 108*a* and 84*a* this results in a variation of the output frequency $f_o$ over a range of 1 MHz in 100 Hz steps for each basic step of 1 MHz in the frequency range of 10 to 150 HMz.

If the desired output frequency is 31.6542 MHz, and frequency dividers 108*a* and 84*a* are programmed for a division factor of 30, the output of divider 146 will be a signal having a frequency of 1.6542 MHz. Consequently, the output from frequency divider 108*a* is a signal having a frequency 55.14 KHz and the output from oscillator 94*a* is phase-locked to a signal having a frequency of 1.05514 MHz. Oscillator 16*a* is phase-locked to the 30th harmonic of this frequency or 31.7542 MHz.

In order to obtain a frequency of 1.6542 MHz from frequency divider 146, the output signal of oscillator 216 must be a signal having a frequency of 16.542 MHz. Therefore, the output signal from oscillator 16*c* must have a frequency of 14.2 MHz, and the output from frequency divider 144 must be a signal having a frequency of 142 KHz. The output from oscillator 16*b* is then 16.4 MHz. The sum of the frequencies of the signals from frequency divider 144 and oscillator 16*b* equals the output signal frequency from oscillator 216, which, as stated above, is 16.532 MHz. The external decade switch programming frequency divider 84*c* is set at 42 and for frequency divider 84*b* it is set at 64. Internally the frequency dividers are programmed for division ratios 142 and 164 respectively. Frequency dividers 108*a* and 84*a* are both programmed internally at 30 while the external programmer reads 31.

Applying the above example to the frequency synthesizer shown in FIG. 5, oscillator 242 must oscillate at a frequency of 1.6542 MHz in order to provide the required signal frequency for interpolation frequency divider 108*a*. The basic step frequency $f_1$ generated by oscillator 12 is 1 MHz and after division by 10,000 appears on line 272 as 100 Hz. Serially connected gated frequency dividers 246, 248, 250 and 252 must therefore divide by a factor of 16,542 so that the signal on line 262 has a frequency equal to 100 Hz. This condition is assured by the phase-lock loop associated with oscillator 242. For this condition $m = 65$ and $p = 42$ as above.

In electronic systems, including radio and television receivers and the like there often occurs a need for signals having a frequency which differ from a selected harmonic of a reference frequency by a fixed offset frequency. The frequency synthesis element shown in FIG. 1 may be employed to generate such signals. The frequency $f_3$ generated by oscillator 80 (see FIG. 1) may be used as the fixed offset frequency. The output signal frequency generated by oscillator 16 is phase-locked on a harmonic of the auxiliary reference frequency $f_2$ contained in the second harmoic spectrum rather than being phase-locked on a harmonic of the primary reference frequency $f_1$ contained in the first harmonic spectrum. The gate 38 is coupled to a signal having a frequency equal to the beat frequency between the frequency $f_0$ generated by oscillator 16 and the harmonics contained in the first harmonic spectrum.

Referring now directly to FIG. 1, the aforementioned requirements may be met by making the following alterations to the system in FIG. 1. The output signal frequency generated by oscillator 94 is set equal to a frequency $f_1$. Alternatively, the output signal from oscillator 12 could be coupled directly to line 18. The frequency $f_3$ generated by oscillator 80 is set equal to the desired offset frequency. Those portions of FIG. 1 used to inject the interpolation frequency $f_i$ are made inoperative. Line 26 from pulse generator 20 is connected to pulse mixer 60 instead of to pulse mixer 24 and line 64 from pulse generator 56 is connected to pulse mixer 24 instead of to pulse mixer 60. The programmable frequency divider 84 is programmed in the same manner as described above with reference to the unmodified system in FIG. 1. Programming divider 84 provides the means for selecting the various harmonics in the second harmonic spectrum to which oscillator 16 is phase-locked.

Due to the cross-over connections in relation to pulse generators 20 and 56 and pulse mixers 24 and 60, the frequency of oscillator 16 continues to be controlled by pulse mixer 24 and hunting circuuit 48 as described above in relation to FIG. 1. The beat frequency signal generated by pulse mixer 60 has a frequency equal to the offset frequency when the frequency of oscillator 16 is phase-locked to the required harmonic in the second harmonic spectrum. The signal from pulse mixer 60 is coupled to gate 38. As previously described, gate 38 generates an enabling signal on line 36 thereby operating pulse mixer 24 and phase-locking oscillator 16 to a frequency equal to a selected harmonic in the second harmonic spectra displaced by a desired offset frequency.

What I claim is:

1. A frequency synthesizer for generating an output signal having a frequency which is variable in discrete steps over a prescribed frequency range, each step having a predetermined maximum size and including intermediate interpolation steps, said frequency synthesizer comprising:

i. means for generating a signal having a frequency equal to a primary reference frequency;

ii. means for generating an interpolation signal frequency;

iii. frequency dividing means having a variable dividing ratio *n*, including means for coupling said frequency dividing means to said means (ii), said frequency dividing means being responsive to said interpolation signal for generating a first output signal having a frequency equal to said interpolation signal frequency divided by a said variable dividing ratio *n;* iv. frequency generating means coupled to said means (i) and said means (iii) for generating a secondary reference signal having a frequency equal to said primary reference signal frequency displaced by the frequency of said first output signal;

v. a controllable oscillator for producing said output signal and including a frequency control means for tuning said controllable oscillator across a predetermined frequency range and for locking said output signal frequency to a predetermined frequency within said predetermined frequency range;

vi. programmable signal generator means for generating a programming signal having a frequency equal to a unique value when said controllable oscillator output signal has a frequency equal to said predetermined frequency;

vii. harmonic selection means for phase-locking said output signal frequency to a harmonic of said secondary reference signal frequency including means for coupling said harmonic selection means to said secondary reference signal and to said programming signal, said harmonic selection means being responsive to said programming signal for producing a control signal for operating said frequency control means so that said output signal is phase-locked on the selected harmonic of said secondary reference signal frequency; and viii. said frequency control means being connected to said harmonic selection means and responsive to said control signal for establishing the frequency of said output signal at said predetermined frequency when said programming signal frequency is equal to said unique value.

2. A frequency synthesizer as claimed in claim 1, in which said interpolation signal frequency is equal to a multiple of a subharmonic of said primary reference signal frequency.

3. A frequency synthesizer as claimed in claim 2, in which said subharmonic of said primary reference signal frequency has a value formed by raising the number 10 to an integral power thereby providing an interpolation signal frequency which is decimally related to said primary reference signal frequency.

4. A frequency synthesizer as claimed in claim 1, in which said output signal frequency is variable in discrete steps which have a maximum size equal to an integral multiple of said primary reference signal frequency.

5. A frequency synthesizer as claimed in claim 1, in which the frequency of said output signal is displaced in frequency by an amount equal to the frequency of said interpolation signal from a selected harmonic of said primary reference signal frequency, said selected harmonic having a harmonic number equal to said variable dividing ratio *n*.

6. A frequency synthesizer as claimed in claim 1, in which said secondary reference signal is generated by a mixing means coupled to said primary reference signal and to said first output signal, said mixing means being operable for comparing the frequency of said primary reference signal and the frequency of said first output signal to produce a second output signal, said second output signal containing a plurality of frequencies including said primary reference signal frequency said first output signal frequency, and the difference frequencies between said primary reference signal frequency and said first output signal frequency, and further including filter means coupled to said second output signal, said filter means being used for generating a signal having a frequency equal to said primary reference signal frequency displaced by the frequency of said first output signal.

7. A frequency synthesizer as claimed in claim 1, in which said frequency generating means for generating said secondary reference signal frequency includes:

i. an auxiliary controllable oscillator for generating a second output signal including a second frequency control means for tuning said auxiliary controllable oscillator across a predetermined frequency range and for locking said second output signal to said secondary reference signal frequency;

ii. first mixing means coupled to said auxiliary controllable oscillator and coupled to said primary reference signal for producing a third output signal having a frequency equal to the difference between the frequency of said primary reference signal frequency and said second output signal frequency;

iii. second comparing means being coupled to said first output signal and to said third output signal for producing a second control signal; and iv. said second frequency controlling means being connected to said second comparing means and being responsive to said second control signal for establishing the frequency of said second output signal at a value so that the frequency of said third output signal equals the frequency of said first output signal.

8. A frequency synthesizer as claimed in claim 1, in which the interpolation signal frequency is equal to the sum of a subharmonic of said primary reference frequency plus a frequency equal to an integer multiple of the primary reference signal frequency.

9. A frequency synthesizer system as claimed in claim 1, comprising in combination a first frequency synthesizer system as claimed in claim 1 and a second similar frequency synthesizer system in which said means for generating said interpolation signal frequency for said first frequency synthesizer system includes: said second frequency synthesizer system, means for coupling the means for generating said primary reference frequency and said programmable signal generator means for said first frequency synthesizer system to said second frequency synthesizer system, means for coupling said output signal generated by said controllable oscillator in said second frequency synthesizer system to a second frequency dividing means having a predetermined dividing ratio, said second frequency dividing means being operable for generating a second output signal having a frequency equal to a submultiple of the frequency of said output signal generated by said controllable oscillator in said second frequency synthesizer system said second output signal being the interpolation signal for said first frequency synthesizer system, thereby establishing the frequency of said interpolation signal for said first frequency synthesizer system at a frequency which is harmonically related to said primary reference signal frequency.

10. A frequency synthesizer system as claimed in claim 9, in which said second predetermined dividing ratio is equal to an integer which is an integral multiple of the number 10, said integral multiple having a value equal to the number of complete frequency decades covered by said predetermined frequency range for said controllable oscillator in said second frequency synthesizer system, thereby providing an interpolation signal frequency which is a decimal harmonic of said primary reference signal frequency.

11. A frequency synthesizer system as claimed in claim 9, wherein said means for coupling the means for generating said primary reference frequency and said programmable signal generator means for said first frequency synthesizer system to said second frequency synthesizer system include third and fourth frequency divider means respectively, each having the same predetermined dividing ratio for generating output signals having a frequency equal to a submultiple of said primary reference frequency and of said programming signal frequency respectively for said first frequency synthesizer system, thereby establishing the primary reference signal frequency and the programming signal frequency for said second frequency synthesizer system at a subharmonic of the primary reference signal frequency and the programming signal frequency respectively for said first frequency synthesizer system.

12. A frequency synthesizer system as claimed in claim 11, in which said third and fourth predetermined dividing ratios are equal to an integer which is an integral multiple of the number 10, said integral multiple having a value equal to the number of complete frequency decades covered by said predetermined frequency range for said controllable oscillator in said second frequency synthesizer system thereby providing an interpolation signal frequency which is a desired harmonic of said primary reference signal frequency.

13. A frequency synthesizer as claimed in claim 1, in which said means for generating said interpolation signal includes:

i. a controllable interpolation oscillator for producing a second output signal having a variable frequency, said interpolation oscillator including a second frequency control means for tuning said interpolation oscillator over a prescribed frequency range and locking the frequency of said second input signal to said interpolation signal frequency;

ii. gated frequency divider means coupled to said interpolation oscillator and having a variable dividing ratio programmed to divide the frequency of said second output signal by a factor decimally related to said required interpolation frequency for producing a third output signal having a frequency equal to a selected sub-harmonic of said interpolation signal frequency;

iii. fixed frequency dividing means coupled to said primary reference signal frequency for producing a fourth output signal having a frequency equal to a sub-harmonic of said primary reference signal frequency equal to said selected subharmonic;

iv. comparing means coupled to said gated frequency divided means and said fixed frequency dividing means, said comparing means being responsive to said third and fourth output signals for generating a second control signal; and v. means coupling said second frequency control means to said comparing means, said second frequency controlling means being responsive to said second control signal for establishing the frequency of said second output signal at a frequency equal to said interpolation signal frequency.

14. A frequency synthesizer as claimed in claim 13, in which the smallest incremental decimal step in the interpolation signal frequency corresponds to said subharmonic of said primary reference frequency.

15. A frequency synthesizer system for generating a signal having a frequency which differs from a selected harmonic of a reference frequency by a fixed offset frequency which includes:

i. means for producing a first harmonic spectrum containing harmonics of a primary reference frequency;

ii. controllable signal generator means for producing a second harmonic spectrum containing harmonics of a auxiliary reference frequency;

iii. a controllable oscillator for generating a first output signal of variable frequency $f_1$ and including a first frequency control means for tuning said controllable oscillator over a predetermined frequency range and for locking said first output signal to a predetermined frequency, said frequency range including a selected portion of said second harmonic spectrum;

iv. first circuit means coupled to said controllable oscillator and to said means (ii) for comparing the phase of said first output signal with the signal generated by said means (ii) and operable to produce a first control signal having an amplitude dependent on the relative phase difference between the first output signal and the signal generated by said means (ii), said amplitude having a unique value when the frequency difference between the first output signal and a selected harmonic in the second harmonic spectrum has a desired value;

v. said first frequency control means being connected to said first circuit means and being responsive to said first control signal for establishing the frequency of said first output signal at said predetermined frequency when said first control signal has said unique value;

vi. sweeping means coupled to said first frequency control means and operable by said first control signal for sweeping the frequency of said first output signal across said second harmonic spectrum when said first output signal frequency is different from said predetermined frequency;

vii. a second frequency control means having first and second signal inputs connected to said means (i) and to said means (ii) for comparing the frequency difference between the output signal frequency of said means (i) and (ii) with subharmonics of a programmed reference signal having a frequency equal to a first selected fixed frequency and for generating a second control signal; said second control signal being coupled to said means (ii) for controlling said second harmonic spectrum so that the harmonics in said second harmonic spectrum have a predetermined relationship with the harmonics in said first harmonic spectrum and one specific harmonic in said second harmonic spectrum differs in frequency from said selected harmonic in said first harmonic spectrum by said first selected fixed frequency;

viii. second circuit means coupled to said controllable oscillator and to said means (i) for mixing said first output signal with frequencies in said first harmonic spectrum to produce a second output signal having a frequency equal to a second selected fixed frequency when said specific harmonic in said first harmonic spectrum differs in frequency from the frequency of said first output signal by an amount equal to said second selected fixed frequency; and ix. gate means coupled to said means (viii) and responsive to said second output signal and coupled to said means (iv) for producing a third control signal to enable said means (iv) when the frequency of said second output signal is within a predetermined frequency range centered about a frequency equal to said second selected frequency, wherein said means (iv) is enabled and generates said first control signal thereby establishing the frequency of said first output signal at said predetermined frequency which is equal to said selected harmonic in said first harmonic spectrum plus said first selected fixed frequency.

* * * * *